United States Patent [19]

Wijnaendts-van-Resandt

[11] Patent Number: 5,103,257
[45] Date of Patent: Apr. 7, 1992

[54] PROCESS FOR PRODUCING OR INSPECTING MICROPATTERNS ON LARGE-AREA SUBSTRATES

[75] Inventor: Roloef Wijnaendts-van-Resandt, Bad Schönborn, Fed. Rep. of Germany

[73] Assignee: Heidelberg Instruments GmbH, Heidelberg, Fed. Rep. of Germany

[21] Appl. No.: 500,312

[22] Filed: Mar. 28, 1990

[30] Foreign Application Priority Data

Mar. 28, 1989 [DE] Fed. Rep. of Germany ....... 3910048

[51] Int. Cl.⁵ ............................................. G03B 27/42
[52] U.S. Cl. .......................................... 355/53; 355/1; 355/54
[58] Field of Search .............................. 355/53, 54, 1

[56] References Cited

U.S. PATENT DOCUMENTS

| 4,118,230 | 10/1978 | Binder | 96/27 |
|---|---|---|---|
| 4,202,631 | 5/1980 | Uchiyama et al. | 356/394 |
| 4,247,203 | 1/1981 | Levy et al. | 356/390 |
| 4,538,914 | 9/1985 | Yomoda et al. | 356/400 |
| 4,769,680 | 9/1988 | Resor et al. | 355/53 |
| 4,924,257 | 10/1988 | Jain | 355/53 |
| 4,958,160 | 9/1990 | Ito et al. | 355/53 |
| 4,980,718 | 12/1990 | Salter et al. | 355/53 |

FOREIGN PATENT DOCUMENTS

| 292976 | 11/1988 | European Pat. Off. . |
| 2642634 | 3/1978 | Fed. Rep. of Germany . |
| 3247560 | 6/1983 | Fed. Rep. of Germany . |
| 3305014 | 9/1983 | Fed. Rep. of Germany . |

OTHER PUBLICATIONS

Patents Abstracts of Japan, P-481, Jul. 26, 1986, vol. 10, No. 21.
JENA Brochure, p. 9.

*Primary Examiner*—Monroe H. Hayes
*Attorney, Agent, or Firm*—Foley & Lardner

[57] ABSTRACT

A process for producing micropatterns on large-area substrates, especially liquid crystal displays, in which patterns are transferred from at least one mask onto a substrate by optical means which contain lens or mirror systems. Patterns are sensed continuously from the mask in small areas and transferred by an optical system to the substrate. The transfer system, the mask, and the substrate are positionable relative to one another. The process enables large-area displays having side lengths of at least 10 centimeters to be manufactured reliably and in large quantities. Apparatus for carrying out the process is also disclosed.

22 Claims, 4 Drawing Sheets

PROCESS FOR PRODUCING OR INSPECTING MICROPATTERNS ON LARGE-AREA SUBSTRATES

BACKGROUND OF THE INVENTION

This invention relates to a process for producing micropatterns on large-area substrates, especially liquid crystal displays, in which patterns are transferred from at least one mask onto a substrate by optical means. This process can furthermore be used in inspecting micropatterns on large-area substrates. Micropatterns on large-area substrates are required primarily for liquid crystal displays. The invention furthermore relates to an apparatus for the carrying out of the claimed process.

The art of liquid crystal displays has reached a high level, and there are already many applications, such as automobile dashboard displays or the screens of portable computers, and, in particular, liquid crystal displays offer a promising technology for the replacement of the TV cathode-ray tubes still commonly used today. There are some technological difficulties facing the growing interest in such large-area displays, and they will be explained below.

Liquid crystal displays are manufactured by lithographic methods, according to which patterns are transferred from at least one mask—often up to ten masks—to a substrate, such as a glass plate, for example. The transfer is usually performed by an optical method in which beams from a light source or laser beams project the patterns of the mask onto a photosensitive coating on the substrate, and the pattern is then fixed on the substrate by etching or other such methods in additional process steps. As the size of the displays increases, the optical means containing lenses or mirror systems become correspondingly larger and more unwieldy, and the difficulty of making them increases considerably. Furthermore, imaging errors must be expected, so that accuracy requirements can no longer be satisfied, and very small patterns of the order of 4 micrometers or even 1 micrometer can no longer be used. Large-area displays, with a length on each side of at least 10 cm, or advantageously 20 cm and more, cannot be satisfactorily produced by the methods common today, which appear entirely feasible for smaller displays.

SUMMARY OF THE INVENTION

It is therefore the object of the invention to provide a process for manufacturing large-area displays, meaning lengths of at least 10 centimeters on a side, but advantageously as long as 20 centimeters or more, in a reliable manner and in large numbers.

It is also an object of the invention to provide a process for manufacturing large-area displays which assures high precision, so that extremely small patterns, down to at least 4 micrometers, and preferably down to 1 micrometer, can be transferred reliably from a mask onto a substrate.

A further object of the invention is to provide a process for producing large-area displays in which transference errors or distortion of the smallest patterns is less than 1 micrometer and preferably less than 0.25 micrometers over the entire area of the substrate.

Another object is to provide a process for producing large-area displays which permits economical production of the substrates, whereby quantities of 50 to 100 units per hour or more can be manufactured with high precision.

An additional object of the invention is to provide apparatus for producing large-area displays according to the claimed process which has a simple and reliably operating design and which enables manufacture of large-area displays with a high reliability and precision.

These and other objects of the invention are achieved by providing a process for producing micropatterns on large-area substrates comprising the steps of scanning successive portions of at least one mask bearing a pattern to be transferred with an optical transfer system to produce an optical beam containing information regarding said pattern, and directing said beam with said optical transfer system onto a receptive substrate to transfer said pattern to said substrate, wherein said mask, said transfer system and said substrate are positionable relative to each other, further comprising sensing the relative positions of said mask and said substrate during said scanning and transfer and adjusting the position of said mask and said substrate relative to each other as needed to maintain a predetermined relative position between said mask and said substrate.

In accordance with another aspect of the invention, the objects of the invention are achieved by providing a process for inspecting micropatterns formed on a large-area substrate containing micropatterns, wherein corresponding portions of a pattern on said substrate and a corresponding pattern on a mask are continuously scanned and the results of the scanning are transmitted by an optical transfer system to a comparator, and wherein said mask, said transfer system and said substrate are positionable relative to each other, further comprising sensing the relative positions of said mask and said substrate during said scanning, and adjusting the position of said mask and said substrate relative to each other as needed to maintain a predetermined relative position between said mask and said substrate.

In a further aspect of the invention, its objects are achieved by providing an apparatus for producing micropatterns on large-are substrates comprising: means for holding a mask defining a pattern to be transferred onto a substrate, means for holding a substrate onto which said pattern is to be transferred, movable optical transfer means, drive means associated with said optical transfer means for moving said optical transfer means in a predetermined direction to scan a mask in said mask holding means and transfer a pattern on said mask to said substrate in said substrate holding means, and a drive unit operably associated with said mask holding means and said substrate holding means for positioning said mask holding means and said substrate holding means together in a direction essentially perpendicular to the direction of movement of said transfer means.

The proposed process enables manufacture of large-area displays, especially liquid crystal displays, with side lengths greater than 20 by 25 centimeters and especially greater than 40 by 50 centimeters. The lithographic process according to the invention is characterized by a high rate of production. The entire area is continuously scanned and transferred by projection on a 1:1 scale. Complex optical systems are eliminated, and no limits are placed by the optical system on the possible dimensions of the display. The projection of a small mask field with a field size adapted to the resolution requires no special optical systems, and instead standard systems can be used for the purpose. The mechanical scanning system permits attaining an optimum between the precision of the positioning and of the scanning speed. The optical transfer means is positioned in two orthogonal directions as regards the mask and the substrate. Preferably the one direction of movement is handled by the optical transfer means and the other movement by the mask and the substrate. To prevent irregularities resulting from sagging of the mask and/or substrate, they are best disposed in vertical planes parallel to one another. Furthermore it is desirable to move the mask and the substrate horizontally, and to move the optical system, which has a comparatively small mass, upward and downward in the vertical direction. To compensate for velocity variations in the vertical movement of the optical system, the energy of the beam source for the optical transfer means is controlled in accordance with the velocity and/or the momentary location.

The process of the invention can furthermore be used for the inspection of patterns on large-area substrates. For this purpose both the areas of the mask and of the micropatterns to be inspected on the substrate are compared with one another. The above-indicated advantages of the manufacturing process apply in like manner to inspection. The optical transfer means contains detectors suitable for inspection, the two objectives serving as reading objectives. The images or optical signals obtained from scanning the field areas of the mask and substrate are delivered especially through light-conducting means to a comparing apparatus and compared with one another to detect any defects in the micropatterns of the substrate.

In one advantageous embodiment an autofocus system is associated with the optical transfer means, which facilitates precise detection of the mask patterns and precise transfer to the substrate. Height variations of the magnitude of up to 10 micrometers and more are equalized by the autofocus system during the lithography process. A high transfer quality is assured by use of dynamic focusing.

In a further embodiment, the second and subsequent masks are brought by an aligning system to the desired definite reference position with respect to the substrate and to the layers of the substrate applied in the preceding process steps. With comparatively little complication, a flexible and dynamic alignment between the masks and the substrate is performed. For this purpose it has been found advantageous when the pattern of the first mask is being transferred to transfer marks simultaneously to the substrate or its first layer, and to align the subsequent masks with the aid of these marks.

Additional advantages and important embodiments of the invention will be apparent from the dependent claims and from the drawing in conjunction with the description.

BRIEF DESCRIPTION OF THE DRAWINGS

The invention will be described hereinafter with reference to a preferred embodiment of an apparatus adapted to carry out the claimed process which is illustrated schematically in the drawings, wherein:

DETAILED DESCRIPTION OF PREFERRED EMBODIMENTS

Figure 1:
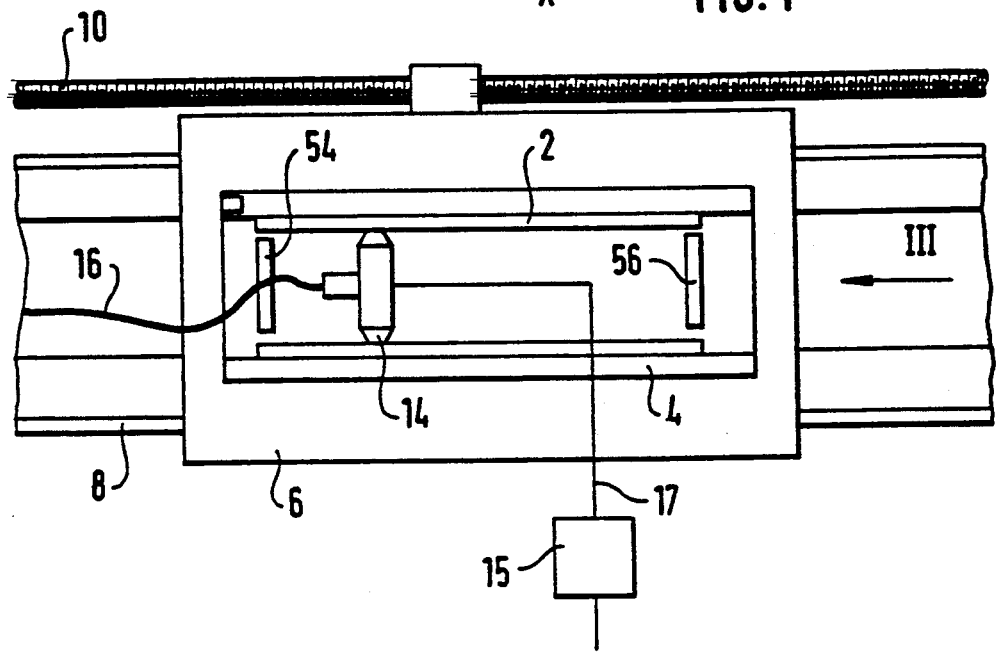
FIG. 1 is a top plan view.

FIG. 1 is a top plan view of an apparatus for carrying out the process of the invention for transferring patterns from a mask 2 to a substrate 4. The mask 2 and the substrate 4 are disposed parallel to one another in vertical planes on a table 6 which can travel in a horizontal direction in a frame. The table 6 can travel and be positioned in the horizontal direction X with respect to a stator 8, which is preferably a heavy granite slab and thus assures isolation from external effects. A precision drive with a spindle 10 can be provided for this purpose. The table 6 is preferably mounted on the stator 8 on precision ball bearing guides for travel in the direction X, as indicated by the double arrow 12. Detectors 54 and 56 are disposed between the mask 2 and the substrate 4. These detectors are provided in accordance with the invention for precisely aligning the mask 2 with respect to the substrate 4, as will be explained below.

Between the mask 2 and the substrate 4 there is an optical transfer means 14 which can travel in the vertical direction, i.e., perpendicular to the plane of the drawing. With this optical transfer means, portions of the mask patterns are projected in a 1:1 ratio and transferred to the substrate 4. The optical transfer means 14 is connected by light-conducting means 16 to a source of radiation. This radiation source may be a laser or a lamp for ultraviolet rays, for example. The light-conducting means 16 may comprise glass fibers or it may be an optical system of lenses or the like. The important thing is that all of the pattern on the mask is scanned in individual small areas which are transferred continuously onto the substrate. The size of the field is coordinated with the resolution of the optical transfer means. Instead of large, complex projection systems, a comparatively small optical system can be used according to the invention, and essentially no limitations need be placed on the size of the patterns to be transferred from the mask to the substrate. The image field of the scanning system can be adapted to the requirements with regard to resolution and precision. High resolution is assured by the contemplated 1:1 projection of the mask areas onto the pattern, and small patterns of less than 4 micrometers, and preferably even smaller than 1 micrometer, are correctly transferred. Transference errors or distortions which occur in large optical systems, particularly in the marginal areas, are prevented.

In accordance with the process of the invention, the respective portions of the mask are transferred to the substrate by the transfer means in a 1:1 projection. The mask is constructed as a positive and reflects the light rays which come from the transfer means and which after reflection by the transfer means 14 are conducted to the substrate 4. This process results in an extremely simple mechanical construction of the apparatus, inasmuch as the transfer means can be located without any difficulty in the free space between the mask and the substrate and need not be positioned with great precision. Transmitted light processes in which the mask is a negative through which light beams pass are likewise within the scope of the invention. The 1:1 projection of the mask patterns onto the substrate, in each case onto predetermined parts thereof, is also carried out in transmitted light processes in accordance with the invention.

The process can furthermore be used for inspecting micropatterns on large-area substrates. The rays delivered from the light source through the light conducting means 16 to the transfer means serve to scan the mask 2 as well as the micropatterns of the substrate 4. The rays reflected by the mask 2 and also the rays reflected by the micropatterns of the substrate 4 are delivered by the transfer means 14 to additional light-conducting means 17, and a comparator 15 illustrated here only schematically. In this comparator 15 the scanned image information from the mask 2 on the one hand and from the micropatterns on the other are compared with one another, and any defects in the micropatterns are reliably recognized. It should be understood that two masks can be compared with one another within the scope of the invention, in which case a second mask would be provided instead of the substrate mentioned above. Furthermore, the micropatterns of two large-area substrates can be compared with one another in accordance with the invention.

Figure 2:
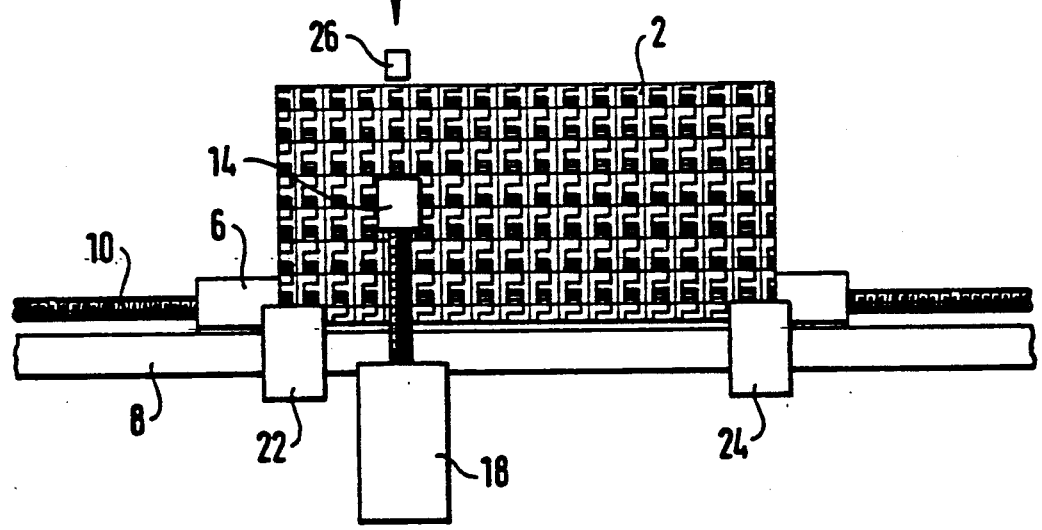
FIG. 2 is a side elevational view.

FIG. 2 shows a diagrammatic side view seen in the direction of the mask 2, the substrate being omitted for the sake of clarity. Connected to the stator 8 is a drive by means of which the optical transfer means 14 can be positioned vertically in the direction of the Y axis as indicated by the double arrow 20. The table 6 with the mask 2 and also with the substrate is horizontally positionable with respect to the stator 8. Layers are disposed successively on the substrate according to the patterns of different masks. To obtain a defined alignment of the individual masks and of the patterns to be transferred from them onto the substrate and its layers, a system is provided for aligning the masks with respect to the substrate. It is assumed that the substrate is fixedly disposed on the table 6. On the other hand the mask can be positioned with reference to the table and hence with reference to the substrate. Of course, the arrangement can also be made in such a way that the mask is fixed and the substrate is correspondingly positionable. Two drives 22, 24, are arranged on the table 6 which enable fine alignment of the mask 2 in the vertical direction. Furthermore, two drives, of which only one drive 26 can be seen, are present to facilitate fine alignment of the mask 2 in the horizontal direction.

Figure 3:
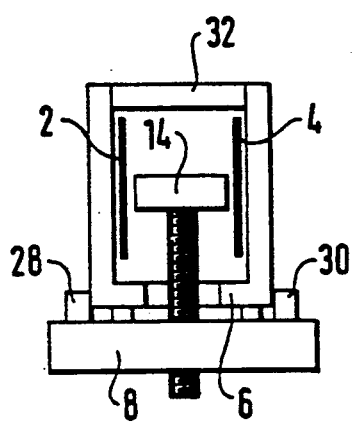
FIG. 3 is a view seen in viewing direction III indicated in FIG. 1.

FIG. 3 schematically shows the apparatus with the granite stator 8 on which the table 6 can be moved on bearings 28 and 3 perpendicular to the plane of the drawing. Also seen on the table 6 is the frame 32 of U-shaped cross section, which carries the mask 2 on one side and the substrate 4 on the other side. As can be seen, the mask 2 and the substrate 4 are arranged parallel to one another in vertical planes, the mask 2 being able to be aligned with respect to the substrate 4 by means of the alignment system described above.

Figure 4:
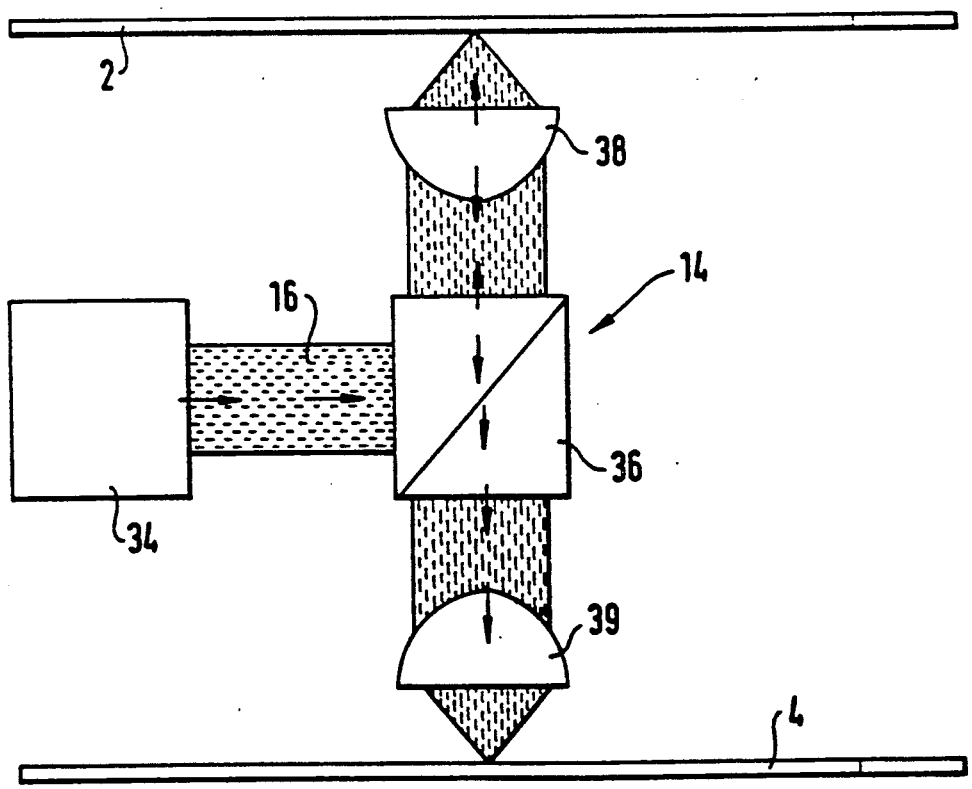
FIG. 4 is an enlarged view of the optical system.

FIG. 4 schematically illustrates the arrangement of the 1:1 projection transfer means between the mask 2 and the substrate 4. A light source 34, which may be a lamp or a laser, sends beams through the light conducting means 16 to a beam splitter system 36 of the transfer means 14. Rays from the polarized system 36 are focused by a first objective 38 onto the mask 2 in order to detect the desired portion of the pattern. The rays reflected from the mask 2 return to the beam splitter system 36 and from there they are focused on the substrate 4 by a second objective 39. The two objectives 38 and 39 are of corresponding design.

Figure 5:
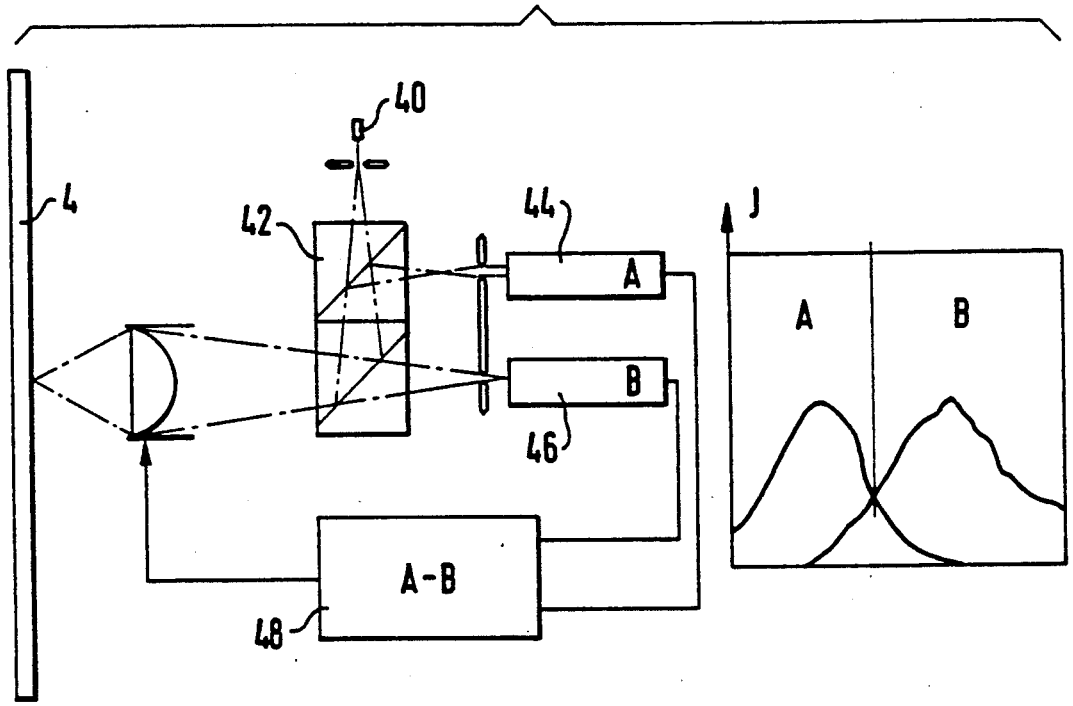
FIG. 5 is a schematic view of the co-focal autofocusing system.

FIG. 5 is a schematic representation of the confocal autofocusing system, which serves to continuously detect and compensate for changes in the distance between the mask and the substrate. Furthermore, with the autofocusing system the position of the objectives, particularly their read lenses and write lenses, is adjusted with respect to the associated surfaces. Two different effects are compensated for. One is small, incidental spacing variations that are smaller than about one micrometer over the entire field of about one centimeter. Furthermore, another is low frequency changes inherent in the system, and which are due, for example, to wedge errors or the like. These changes can amount to between 20 to 90 micrometers over a range of about 50 centimeters. From a point light source 40, which may be constructed as a diode laser, for example, rays pass through a beam splitter 42 and the objective onto the substrate 4. Reflected rays pass through the objective and the beam splitter 42 to detectors 44, 46. As indicated in the small diagram on the right, the two detectors 44, 46, produce two intensity curves A and B whose intersection represents the best focus adjustment. As indicated, the objective is adjusted by the control unit 48 to this optimum focal plane in accordance with the difference in the detector signals.

Figure 6:
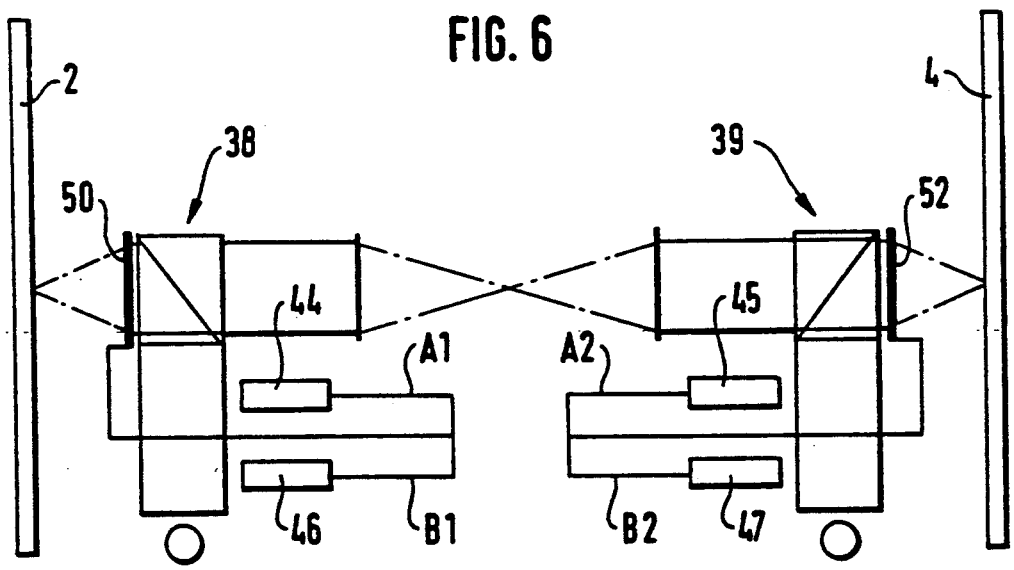
FIG. 6 illustrates the arrangement of the autofocusing system.

As can be seen from FIG. 6, an autofocusing system according to FIG. 5 is associated both with the first objective 38 of the mask 2 and with the second objective 39 for the substrate 4. In accordance with the signals A1 and B1 received from the detectors 44 and 46, respectively, the read lens 50 of the first objective 38 is positioned with respect to the mask 2. In like manner, with the signals A2 and B2 from detectors 45 and 47, respectively, the write lens 52 of the second objective 39 is positioned with respect to the substrate 4. Because of the proposed autofocusing system a precise imaging and transfer of the mask patterns to the substrate is achieved. The axial positioning of the read lens 50 and write lens 52 is advantageously assured with piezoelectric actuators, particularly those containing parallel spring guides.

Figure 7:
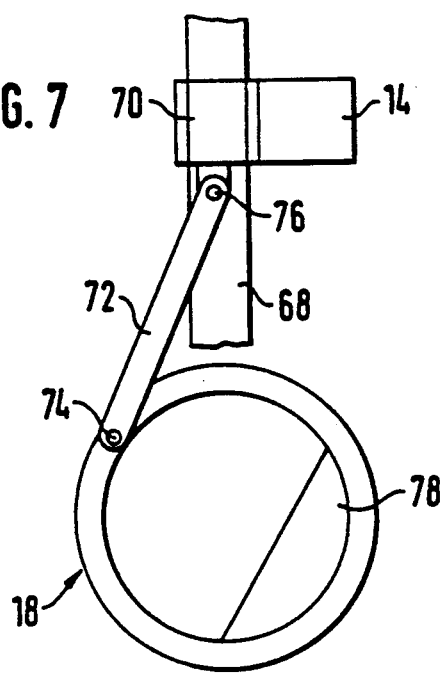
FIG. 7 shows the drive system of the transfer means.

FIG. 7 shows an example of the configuration of the drive 18 for vertical movement of the optical system 14. The optical system 14 is displaceable along a vertical guide 68 which preferably has an air bearing system for a slide 70 with the optical transfer means 14. The rotatory movement of the drive 18 is transmitted by a crank 72 to the slide 70, whereby the articulation at points 74, 76, advantageously takes place under spring bias. A counterweight 78 provides compensation in the continuous upward and downward movement. The linear movement of the slide 70 with the transfer means 14 has a varying velocity. In order to obtain uniform illumination over the entire length of the vertical movement, it is desirable to regulate the energy of the light source 34 in accordance with the momentary vertical position or velocity. The energy input should be greatest for the regions of the greatest vertical velocity, while at the ends of the vertical path of movement, i.e., upon reversal of the movement, the energy input should be adjusted toward zero. Instead of the described drive, other systems of movement could also be used.

To produce a liquid crystal display with integrated thin-film transistors, patterns from several masks generally must be applied successively to the substrate, whereby a predetermined alignment of the patterns of the individual masks with one another must be assured. A suitable alignment system for this purpose will be des with reference to FIGS. 8 and 9. This alignment system is to compensate automatically for small variations, both with regard to the mask as well as the substrate. It should be noted that for the first layer, i.e. for the first pattern to be transferred from the mask onto the substrate, no such alignment is required. In contrast thereto, the second layer or its pattern on the substrate must be positioned precisely with respect to the first layer. This also applies to the succeeding layers or patterns. In view of the large liquid crystal displays with side lengths of 20 centimeters and more, which are to be produced by the process of the invention, any misalignments of the masks of the order of magnitude up to 10 micrometers must be compensated for. This is advantageously effected in two steps, namely an overall prealignment, plus a dynamic alignment with respect to the particular location. The important thing is that with the pattern of the first mask, a mark is applied to the substrate which is used for the alignment of the other masks. A line marked on the margin of the substrate has proven advantageous for this purpose. The second and subsequent masks bear appropriate marks by which the precise alignment of these masks with the substrate is achieved.

Figure 8:
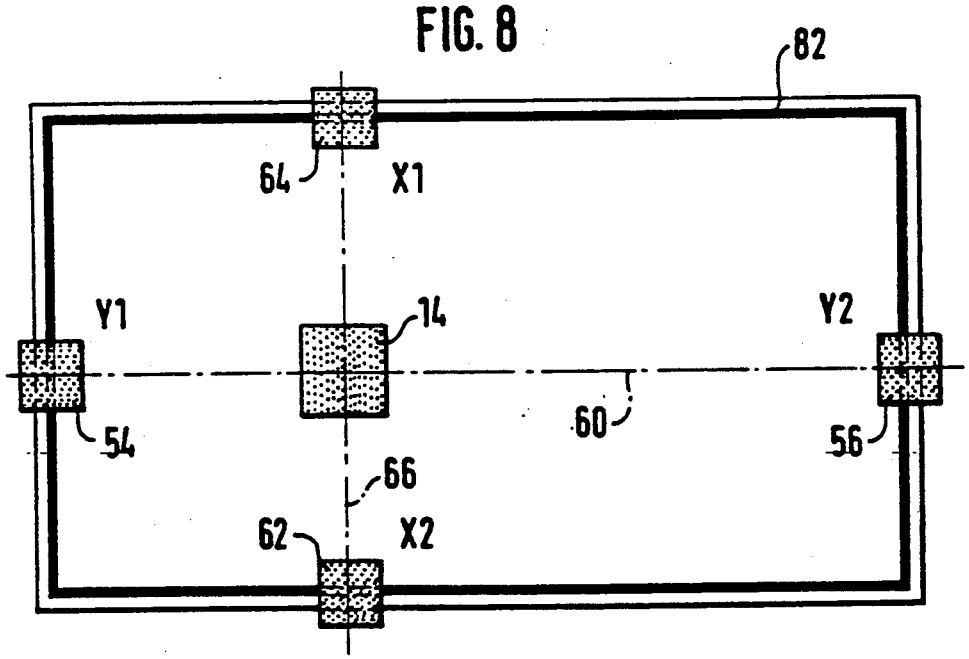

As indicated in FIG. 8, detector 54 and detector 56 are respectively disposed at the margins of the mask or substrate, in order to sense the mark 82 provided thereon for vertical alignment. Responsive to the signals obtained in this way, the drives, which have already been described with reference to FIG. 2, are energized for vertical movement of the masks. The detectors 54, 56, lie in the horizontal plane 60 running through the center of the optical transfer means 14 and are guided accordingly. Furthermore, two X detectors 62, 64, are arranged such that the common vertical plane 66 likewise runs through the center of the optical transmission system 14. The error signals produced by the detectors are processed in suitable manner and serve for precise alignment of the mask with respect to the substrate. It is especially important to note that this alignment is performed constantly as the continuous transfer of the pattern from the mask to the substrate proceeds.

Figure 9:
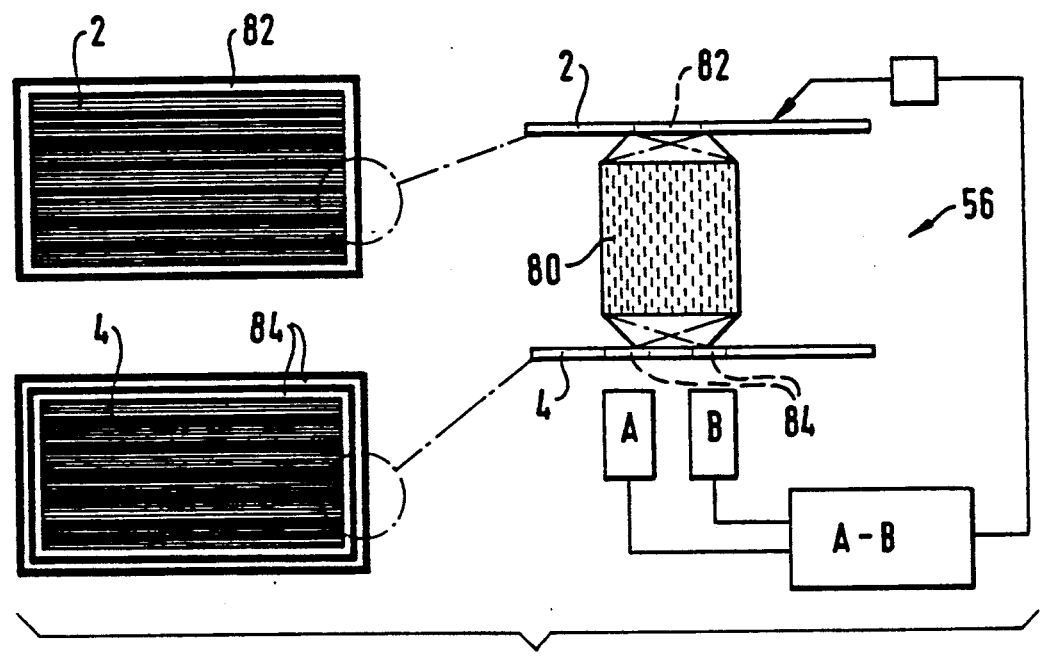
FIGS. 8 and 9 depict the arrangement of the detectors for alignment.

A particular embodiment of the detector 56 is illustrated in FIG. 9. The following statements apply correspondingly to the other detectors. Detector 56 contains a transfer means 80 which, as explained above, is positioned on the same horizontal plane 60 with the optical transfer means 14. The mask contains a mark 82 on its margin which is in the form of a single line. A mark 84, which contains two parallel lines, was placed on the substrate with the first mask. As indicated in the drawing on the right, by means of the transfer means 80, which is constructed as a 1:1 projector, in conjunction with detectors A and B, the relative position of mark 82 with respect to mark 84 on the substrate 4 is detected and, after the difference is computed, it is transmitted to drive 24 for the positioning of the mask. This mask alignment is performed continuously for the second and subsequent masks.

The foregoing description and examples have been set forth merely to illustrate the invention and are not intended to be limiting. Since modifications of the described embodiments incorporating the spirit and substance of the invention may occur to persons skilled in the art, the scope of the invention should be construed to include all modifications falling within the ambit of the appended claims and equivalents thereof.

What is claimed is:

1. A process for producing micropatterns on large-area substrates comprising the steps of scanning successive portions of at least one mask bearing a pattern to be transferred with an optical transfer means to produce an optical beam containing information regarding said pattern, and directing said beam with said optical transfer means onto a receptive substrate to transfer said pattern to said substrate, wherein said mask and said substrate are oriented vertically and arranged on a horizontally movable table parallel to each other and to the direction of horizontal movement of said table, and said transfer means are mounted between said mask and said substrate so as to be vertically movable, whereby said transfer system and said mask and substrate are positionable relative to each other in mutually orthogonal directions to effect said scanning, further comprising providing alignment marks extending along horizontal and vertical margins of each of said mask and said substrate, determining the relative positions of said mask and said substrate during said scanning and transfer by sensing the relative positions of said alignment marks extending along the horizontal margins of said mask and substrate by means of vertical alignment detecting means arranged in a common vertical plane with said transfer means and sensing the relative positions of said alignment marks extending along vertical margins of said mask and substrate by means of horizontal alignment detecting means arranged in a common horizontal plane with said transfer means, said horizontal alignment detecting means moving vertically with said transfer means during said scanning, and adjusting the position of said mask and said substrate relative to each other as needed to maintain a predetermined relative position between said mask and said substrate.

2. A process according to claim 1, wherein said substrate is a liquid crystal display.

3. A process according to claim 1, wherein a plurality of patterns are transferred in succession from a plurality of masks to said substrate, a first alignment mark is applied to said substrate together with a pattern from a first of said plurality of masks, an additional alignment mark is provided on each subsequent mask of said plurality of masks, further comprising the step of continuously aligning each subsequent mask with the pattern from said first mask on said substrate by means of the additional alignment mark of the subsequent mask and said first alignment mark, during transfer of a pattern from the subsequent mask to said substrate.

4. A process according to claim 1, wherein scanned portions of the pattern on said mask are projected in a 1:1 scale on said substrate by said optical transfer means.

5. A process according to claim 1, wherein said optical transfer means comprises a first objective associated with said mask and a second objective associated with said substrate.

6. A process according to claim 5, wherein at least one of said first and second objectives is adjustable by an autofocusing system.

7. A process according to claim 1, wherein said mask is continuously alignable relative to said substrate.

8. A process according to claim 1, wherein a plurality of patterns are transferred to said substrate from a plurality of masks, said method further comprising applying a first alignment mark to said substrate when a pattern is transferred from a first mask to said substrate, and aligning said first alignment mark with a corresponding alignment mark on each subsequent mask when a pattern is transferred from a subsequent mask to said substrate to assure proper registration of said plurality of patterns transferred to said substrate.

9. A process according to claim 1, wherein said vertical alignment detecting means comprise two sensors each of which senses the relative positions of an alignment mark extending along a respective horizontal margin of said mask and of an alignment mark extending along a respective horizontal margin of said substrate, and said horizontal alignment detecting means comprises two sensors each of which senses the relative positions of an alignment mark extending along a respective vertical margin of said mask and of an alignment mark extending along a respective vertical margin of said substrate.

10. A process according to claim 1, wherein said mask and said substrate have substantially the same length and width.

11. A process for inspecting micropatterns formed on a large-area substrates containing micropatterns, wherein corresponding portions of a pattern on said substrate and a corresponding pattern on a mask are continuously by an optical transfer means to a comparator, and wherein said mask and said substrate are oriented vertically and arranged on a horizontally movable table parallel to each other and to the direction of horizontal movement of said table, and said transfer means are mounted between said mask and said substrate so as to be vertically movable, whereby said transfer system and said mask and substrate are positionable relative to each other in mutually orthogonal directions to effect said scanning, further comprising providing alignment marks extending along horizontal and vertical margins of each of said mask and said substrate, determining the relative positions of said mask and said substrate during said scanning by sensing the relative positions of said alignment marks extending along the horizontal margins of said mask and substrate by means of vertical alignment detecting means arranged in a common vertical plane with said transfer means and sensing the relative positions of said alignment marks extending along vertical margins of said mask and substrate by means of horizontal alignment detecting means arranged in a common horizontal plane with said transfer means, said horizontal alignment detecting means moving vertically with said transfer means during said scanning, and adjusting the position of said mask and said substrate relative to each other as needed to maintain a predetermined relative position between said mask and said substrate.

12. A process according to claim 11, wherein said substrate is provided with a first alignment mark, and said mask is provided with a corresponding additional alignment mark, further comprising the step of continuously aligning said substrate and said mask by means of said additional alignment mark on said mask and said first alignment mark on said substrate during scanning of corresponding portions of patterns on said substrate and said mask.

13. A process according to claim 11, wherein said substrate is a second mask.

14. A process according to claim 11, wherein scanned portions of the pattern on said mask are projected in a 1:1 scale on corresponding portions of the pattern on said substrate by said optical transfer means.

15. A process according to claim 11, wherein said vertical alignment detecting means comprise two sensors each of which senses the relative positions of an alignment mark extending along a respective horizontal margin of said mask and of an alignment mark extending along a respective horizontal margin of said substrate, and said horizontal alignment detecting means comprises two sensors each of which senses the relative positions of an alignment mark extending along a respective vertical margin of said mask and of an alignment mark extending along a respective vertical margin of said substrate.

16. A process according to claim 11, wherein said mask and said substrate have substantially the same length and width.

17. An apparatus for producing micropatterns on large-area substrates comprising: means for holding a mask defining a pattern to be transferred onto a substrate in a vertically oriented position, means for holding a substrate onto which said pattern is to be transferred in a vertically oriented position parallel to said mask, vertically movable optical transfer means arranged between said mask holding means and said substrate holding means, drive means associated with said optical transfer means for moving said optical transfer means vertically to scan a mask in said mask holding means and transfer a pattern on said mask to said a substrate in said substrate holding means, a drive unit operably associated with said mask holding means and said substrate holding means for positioning said mask holding means and said substrate holding means together in a horizontal direction parallel to said mask and said substrate, vertical alignment detecting means arranged in a common vertical plane with said transfer means for sensing the relative positions of alignment marks extending along the horizontal margins of said mask and substrate, and horizontal alignment detecting means arranged in a common horizontal plane with said transfer means so as move vertically with said transfer means for sensing the relative positions of alignment marks extending along vertical margins of said mask and substrate.

18. An apparatus according to claim 17, wherein said mask holding means and said substrate holding means are mounted in parallel relation on a horizontally movable table, and said mask holding means comprise a frame for receiving said mask.

19. An apparatus according to claim 17, wherein said vertical alignment detecting means comprise two sensors each of which senses the relative positions of an alignment mark extending along a respective horizontal margin of said mask and of an alignment mark extending along a respective horizontal margin of said substrate, and said horizontal alignment detecting means comprises two sensors each of which senses the relative positions of an alignment mark extending along a respective vertical margin of said mask and of an alignment mark extending along a respective vertical margin of said substrate.

20. A process according to claim 17, wherein said mask and said substrate have substantially the same length and width.

21. An apparatus according to claim 18, further comprising a stand on which said drive means is stationarily disposed, a table displaceably arranged by means of bearings on said stand for movement in a horizontal direction, said table supporting said mask holding means and said substrate holding means, and a guide, and wherein said transfer means is displaceably arranged on said guide for movement in a vertical direction.

22. An apparatus according to claim 17, wherein said transfer means comprises a polarizing beam splitter system, a light source, light conducting means for conducting light from said light source to said beam splitter, a first objective for receiving light from said beam splitter and directing light toward said mask, and a second objective for receiving light reflected from said mask through said beam splitter and directing light toward said substrate, wherein said first and second objectives are configured alike and achieve a 1:1 projection.

* * * * *